US011272786B2

(12) United States Patent
Pei

(10) Patent No.: US 11,272,786 B2
(45) Date of Patent: Mar. 15, 2022

(54) ADJUSTMENT APPARATUS

(71) Applicant: Xubo Pei, Shenzhen (CN)

(72) Inventor: Xubo Pei, Shenzhen (CN)

(*) Notice: Subject to any disclaimer, the term of this patent is extended or adjusted under 35 U.S.C. 154(b) by 171 days.

(21) Appl. No.: 16/672,066

(22) Filed: Nov. 1, 2019

(65) Prior Publication Data
US 2021/0059413 A1 Mar. 4, 2021

(51) Int. Cl.
*A47B 97/00* (2006.01)
*H05K 5/02* (2006.01)
*F16M 13/02* (2006.01)

(52) U.S. Cl.
CPC ......... *A47B 97/001* (2013.01); *F16M 13/022* (2013.01); *H05K 5/0204* (2013.01)

(58) Field of Classification Search
CPC ... A47B 97/001; H05K 5/0204; F16M 13/022
USPC .................................................. 248/917, 923
See application file for complete search history.

(56) References Cited

U.S. PATENT DOCUMENTS

| 7,316,379 | B1* | 1/2008 | Graham | F16M 13/02 248/298.1 |
| 7,891,622 | B1* | 2/2011 | O'Keene | F16M 11/18 248/292.13 |
| 8,262,044 | B2* | 9/2012 | Luijben | F16M 11/10 248/276.1 |
| 8,456,808 | B2* | 6/2013 | Grey | F16M 11/10 361/679.01 |
| 8,746,642 | B2* | 6/2014 | Molter | F16M 13/02 248/299.1 |
| 9,829,151 | B1* | 11/2017 | Stenhouse | F16M 13/02 |
| 2007/0221807 | A1* | 9/2007 | Park | F16M 11/2092 248/324 |
| 2008/0156949 | A1* | 7/2008 | Sculler | F16M 11/10 248/220.21 |
| 2009/0184221 | A1* | 7/2009 | Sculler | F16M 13/02 248/221.11 |
| 2010/0309615 | A1* | 12/2010 | Grey | F16M 11/24 361/679.01 |
| 2011/0297810 | A1* | 12/2011 | Tachibana | F16M 11/041 248/278.1 |

* cited by examiner

Primary Examiner — Muhammad Ijaz
(74) Attorney, Agent, or Firm — Fish IP Law, LLP

(57) ABSTRACT

The adjustment apparatus includes a first support, a second support and a first adjustment assembly. The second support is rotatably coupled to the first support. A fixed portion of the second support passes through first sliding groove of connecting piece of the first adjustment assembly. One end of a driving member of the first adjustment assembly is blocked by the connecting piece and rotates relative to the connecting piece. The other end of the driving member extends along a direction close to the fixed portion and is screwed to the fixed portion. The adjustment apparatus utilizes a threaded transmission relationship between the driving member and the fixed portion to drive the fastening piece to slide relative to the fixed portion of the second support, which cause the hook of the connecting piece slides relative to the fixed portion, thereby providing the adjustment apparatus with novel structure and convenient operations.

21 Claims, 12 Drawing Sheets

ADJUSTMENT APPARATUS

This application claims priority to Chinese 2019216003972, filed Sep. 23, 2019. The entire contents of which are hereby incorporated by reference.

TECHNICAL FIELD

The present disclosure relates to a field of apparatuses for mounting devices, and in particular, to an adjustment apparatus.

BACKGROUND

With continuous advancement of society, people have needs to view or use electronic devices in different environments and different angles. However, the fixed structural design of the electronic devices is often difficult to meet the needs of people in different scenarios and different angles. Even if people can use some tools to assist, these tools are often complicated in structure and inconvenient to operate, and require professional adjustment or guidance in real life.

SUMMARY

Embodiments of the present disclosure provide an adjustment apparatus.

The adjustment apparatus provided by the embodiments of the present disclosure include a first support, a second support and a first adjustment assembly. The second support is rotatably coupled to the first support. The second support includes a fixed portion protruded therefrom. The first adjustment assembly includes a connecting piece and a driving member. The connecting piece defines a hook and a first sliding groove. One end of the driving member is blocked by the connecting piece, and further rotates relative to the connecting piece. The other end of the driving member extends along a direction close to the fixed portion, and is further screwed to the fixed portion. The driving member rotates to drive the connecting piece to slide relative to the fixed portion of the second support, so as to enable the hook to slide relative to the fixed portion.

Wherein, the connecting piece includes a main body and a bending portion. The bending portion is coupled to a top portion of one side of the main body. The top portion defines a first through hole. The one end of the driving member is blocked and coupled to the first through hole of the top portion. The fixed portion passes through the first sliding groove of the connecting piece. The other end of the driving member extends along a direction away from the top portion until it is screwed to the fixed portion.

Wherein, the driving member includes a rotating portion, a connecting portion and a thread portion coupled in sequence. The thread portion protrudes from the first through hole of the top portion, and is further screwed to the fixed portion. The rotating portion is located on one side of the top portion away from the fixed portion. The connecting portion is blocked and coupled to the first through hole of the top portion, and can further rotate in the first through hole of the top portion.

Wherein, an outer peripheral surface of the connecting portion is a smooth curved surface. The first adjusting assembly further includes a limiting member. The limiting member is fixedly coupled to a portion of the connecting portion exposing the first through hole of the top portion. The limiting member abuts on the top portion such that the rotating portion is spaced apart from the top portion by a predetermined distance.

Wherein, the first adjusting assembly further includes a spacer which is sleeved on the driving member, and located between the rotating portion and the top portion.

Wherein, an outer peripheral surface of the rotating portion includes a plurality of protrusions.

Wherein, the rotating portion and the top portion are surface contact.

Wherein, the first sliding groove has a first end and second end opposite to the first end. When the fixed portion abuts the first end or the second end, the other end of the driving member is always coupled to the fixed portion.

Wherein, the connecting piece further defines a guiding groove. An extending direction of the guiding groove is same to that of the first sliding groove. The second support includes a guiding post. The guiding post of the second support passes through the guiding groove of the connecting piece, such that the connecting piece moves along an extending direction of the second support.

Wherein, one side of the second support away from the fixed portion includes a limiting protrusion. The limiting protrusion can abut the first support or separate from the first support with a rotation of the second support relative to the first support.

Wherein, the first support has a curved surface. The limiting protrusion can abut the curved surface of the first support or separate from the curved surface of the first support with the rotation of the second support relative to the first support.

Wherein, the second support includes a second adjustment assembly. The second adjustment assembly is slidably coupled to the second support, and spaced and opposite to the first adjustment assembly. A distance between the second adjustment assembly and the first adjustment assembly can be adjusted.

Wherein, the second adjustment assembly includes a hook and an elastic member. The hook is slidably coupled to the second support. The hook includes a hook portion facing one side of the connecting piece. The elastic member is elastically coupled between the second support and the hook.

Wherein, one side of the second adjustment assembly opposite to the hook includes a pulling member. After the pulling member is pulled, the elastic member is compressed, and the hook moves in a direction of the pulling member.

Wherein, the number of the first adjustment assemblies is two. The two first adjustment assemblies are located on two sides of the second support.

Wherein, the first support further includes a rotating member. The second support defines a connecting hole. The rotating member passes through the connecting hole of the second support, such that the second support is rotatably coupled to the first support.

Wherein, the first support further defines a limiting groove. The second support further includes a fastening piece. The fastening piece of the second support is coupled to the limiting groove of the first support, the second support is rotatably coupled to the first support, such that the fastening piece is driven to move in the limiting groove of the first support.

Wherein, a length of the first support is greater than that of the second support. When the fastening piece slides to one end of the limiting groove of the first support, one end of the second support abuts the first support.

Wherein, the first portion includes a first sub-bracket, a second sub-bracket, and a third sub-bracket coupled in sequence. The first sub-bracket is opposite to the third sub-bracket. The second sub-bracket defines a screw hole. The connecting piece has a top portion. The top portion is disposed opposite to the second sub-bracket and separate to the second sub-bracket with a distance. The top portion defines a second through hole. The one end of the driving member is blocked and coupled to the second through hole of the top portion, and the other end of the driving member extends along a direction away from the top portion until it is screwed to the screw hole of the second sub-bracket.

Wherein, the adjustment apparatus further includes a fixed support. The fixed support includes two sets of horizontal brackets and vertical brackets coupled with each other. The hook of the connecting piece is engaged with the fixed support, such that the adjustment apparatus is fixed through the fixed support.

Wherein, the first support defines first fixing holes and second fixing holes, such that the first support is fixed by using the first fixing holes and the second fixing holes.

Wherein, the first fixing holes of the first support includes at least two through holes, and the second fixing holes includes at least two hollow grooves.

Wherein, the first support includes an upper support and a lower support. The upper support is rotatably coupled to the lower support so as to form the first support. The second support is rotatably coupled to the upper support of the first support. After the lower support is fixed, the upper support rotates so as to drive the second support disposed on the upper support to move.

The adjustment apparatus provided by the embodiments of the present disclosure include a first support, a second support and a first adjustment assembly. The second support is rotatably coupled to the first support. The fixed portion of the second support passes through the first sliding groove of the connecting piece of the first adjustment assembly. One end of the driving member of the first adjustment assembly is blocked by the connecting piece, and further rotates relative to the connecting piece. The other end of the driving member extends along a direction close to the fixed portion, and is further screwed to the fixed portion. The adjustment apparatus provided by the embodiments of the present disclosure utilizes a threaded transmission relationship between the driving member and the fixed portion, and drives the fastening piece to slide relative to the fixed portion of the second support, so that the hook of the connecting piece slides relative to the fixed portion, thereby providing a sliding adjustment apparatus with novel structure and convenient operations.

BRIEF DESCRIPTION OF THE ACCOMPANYING DRAWINGS

To describe the technology solutions in the embodiments of the present disclosure more clearly, the following briefly introduces the accompanying drawings required for describing the embodiments. Obviously, the accompanying drawings in the following description show merely some embodiments of the present disclosure, those of ordinary skilled in the art may also obtain other drawings based on these drawings without any creative efforts.

DETAILED DESCRIPTION OF ILLUSTRATED EMBODIMENTS

The technology solutions in the embodiments of the present disclosure will be described clearly and completely hereinafter with reference to the accompanying drawings in the embodiments of the present disclosure. Obviously, the described embodiments are merely some but not all embodiments of the present disclosure. All other embodiments obtained by a person of ordinary skilled in the art based on the embodiments of the present disclosure without creative efforts shall fall within the protection scope of the present disclosure.

Figure 1:
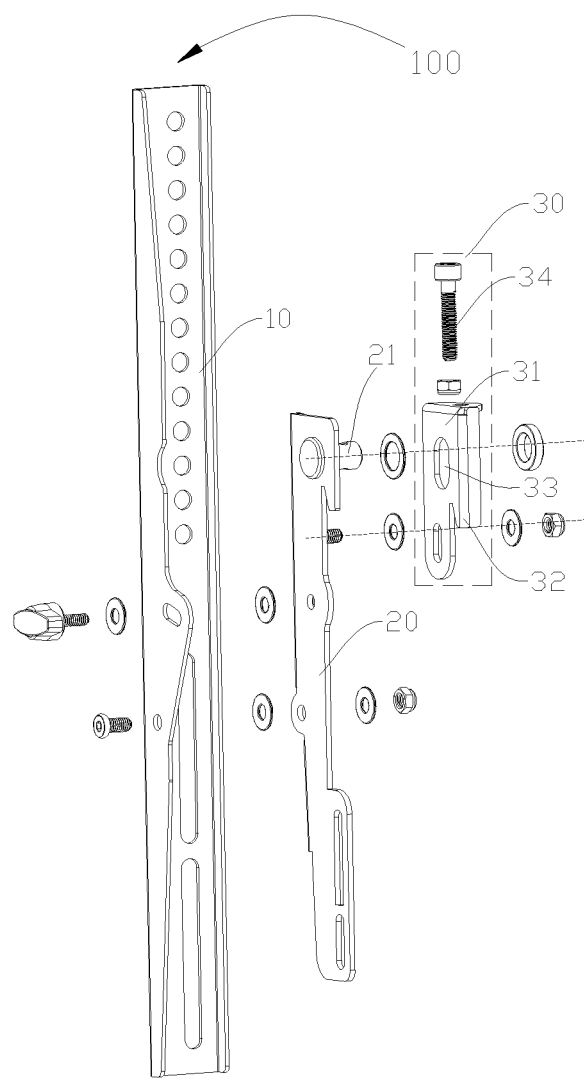
FIG. 1 is a schematic exploded view of an adjustment apparatus provided by one embodiment of the present disclosure.
Figure 2:
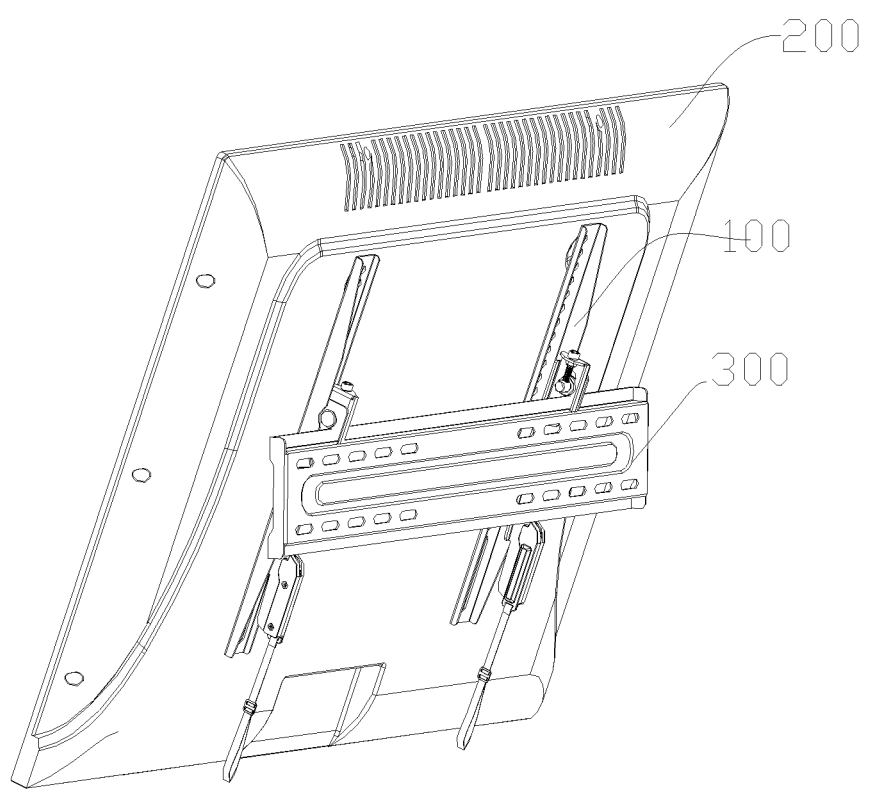
FIG. 2 is a schematic view of the adjustment apparatus shown in FIG. 1 fixed on a device and a fixed support.
Figure 3:
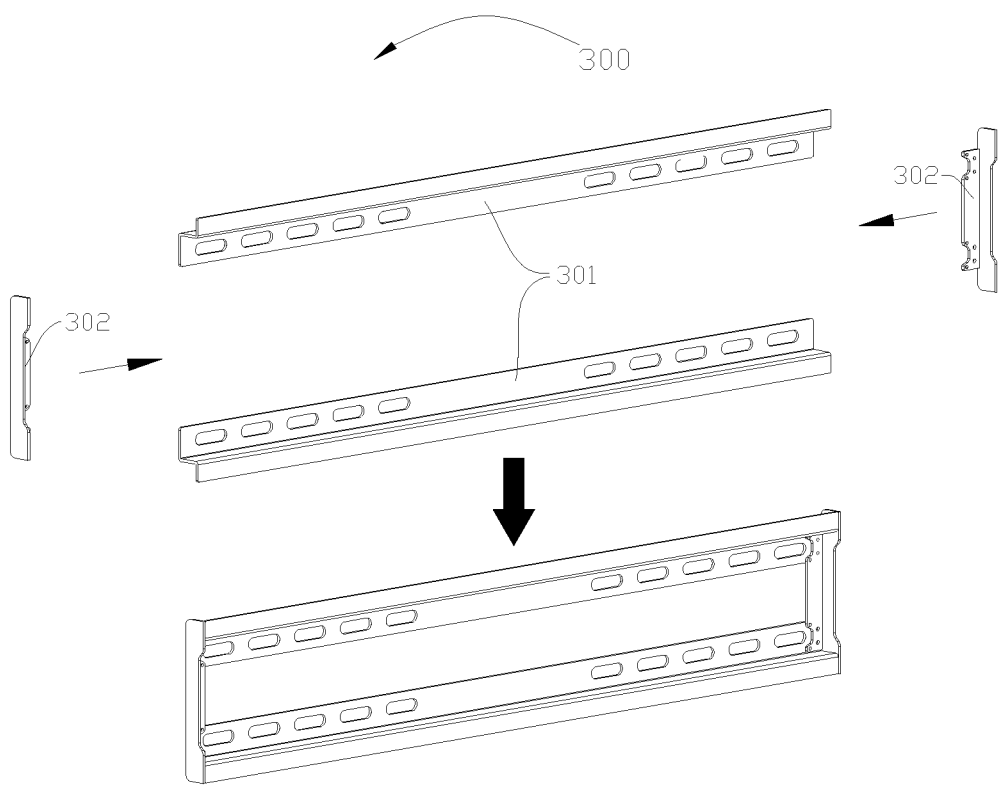
FIG. 3 is a schematic exploded view of the fixed support as shown in FIG. 2
Figure 4:
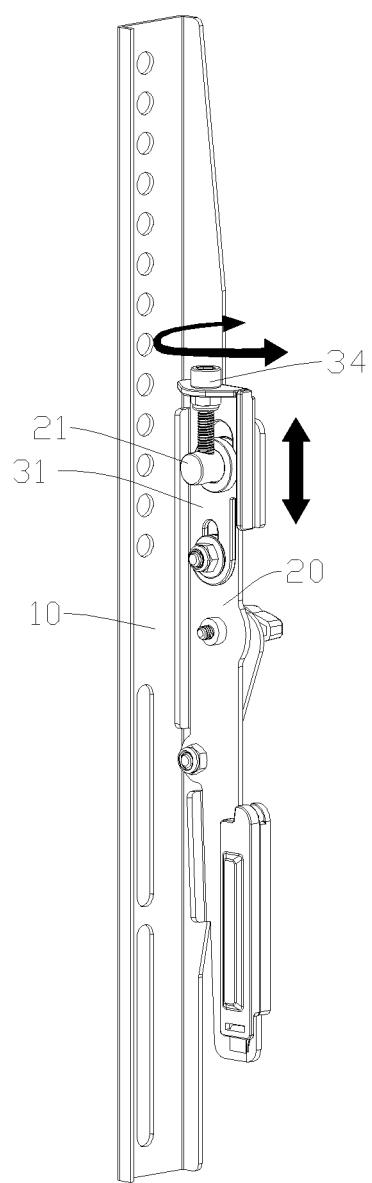
FIG. 4 is a schematic view of a working principle of the adjustment apparatus shown in FIG. 1.

Referring to FIG. 1, an adjustment apparatus 100 provided by embodiments of the present disclosure includes a first support 10, a second support 20 and a first adjustment assembly 30. The second support 20 is rotatably coupled to the first support 10. The second support 20 includes a fixed portion 21 protruded therefrom. The first adjustment assembly 30 includes a connecting piece 31 and a driving member 34. The connecting piece 31 defines a hook 32 and a first sliding groove 33. One end of the driving member 34 is blocked by the connecting piece 31, and further rotates relative to the connecting piece 31. The other end of the driving member 34 extends along a direction close to the fixed portion 21, and is further screwed to the fixed portion 21. The driving member 34 rotates to drive the connecting piece 31 to slide relative to the fixed portion 21 of the second support 20, so as to enable the hook 32 to slide relative to the fixed portion 21. It can be understood that, referring to FIGS. 1 and 2, when the first support 10 of the adjustment apparatus 100 is fixed to a device 200, the fixed portion 21 protruded from the second support 20 passes through the first sliding groove 33 of the connecting piece 31, and the driving member 34 is screwed to the fixed portion 21, two ends of the fixed portion 21 are blocked by the connecting piece 31 and the fixed portion 31 respectively. It can be understood that the first support 10 is fixed to a surface of the device 200, the surface can be a vertical surface or an irregular surface, such that the adjustment apparatus 100 is fixed to the device 200. However, the hook 32 of the first adjustment assembly 30 is configured to hook the fixed support 300, such that the device 200 can be fixed to a position to be installed through the adjustment apparatus 100. Of course, the position that the device 200 to be installed through the adjustment apparatus 100 can be but is not limited to a wall, a pillar, a wardrobe, which can be adjusted according to actual needs of users. For example, the device 200 is installed in midair by the hook 32 of the adjustment apparatus 100 hooked to the fixed support 300 which is installed in midair. In detail, as shown in FIG. 3, in some embodiments, the adjustment apparatus 100 further includes the fixed support 300. The fixed support 300 includes two sets of horizontal brackets 301 and vertical brackets 302 coupled with each other. The hook 32 of the connecting piece 31 is engaged with the fixed support 300, such that the adjustment apparatus 100 is fixed through the fixed support 300. The fixed support 300 is a high-strength fixed support formed by stamping and joining. The fixed support 300 is made up of two sets of horizontal brackets and vertical brackets and pulse welded joints. A person of ordinary skilled in the art of the fixed support generally adopts a traditional welding method, and the traditional welding method requires one welding by one. The present disclosure creatively welds the horizontal brackets and the vertical brackets by pulse welding, thereby welding two sets of the thinner horizontal brackets 301 and the vertical brackets 302 without deformation, and the fixed support 300 is integrally formed after welding, which can increase the strength and use less manpower and material resources. Compared with traditional welding, it has no weld marks, and the connection method can also be welding, assembly, plastic binding and the like. Of course, in other embodiments, the fixed support 300 can be processed through a single board, for example, the fixed support 300 can be processed through an integrated processing method such as a whole plate stamping. In some embodiments, as shown in FIG. 4, when the driving member 34 rotates clockwise, the connecting piece 31 is driven to slide downward relative to the second support 20; when the driving member 34 rotates counterclockwise, the connecting piece 31 is driven to slide upward relative to the second support 20, so that the hook 32 can slide up and down relative to the fixed portion 21. The installation position of the first adjustment assembly 30 can be finely adjusted by the adjustment apparatus 100 by a way of screwing. Of course, in other embodiments, when the driving member 34 rotates clockwise, the connecting piece 31 can be driven to slide upward relative to the second support 20. When the driving member 34 rotates counterclockwise, the connecting piece 31 can be driven to slide downward relative to the second support 20. A thread transmission direction can be adjusted according to actual needs. At the same time, when the connecting piece 31 slides relative to the second support 20 to drive the hook 32 of the connection piece 31 to fine adjust the adjustment apparatus 100, since the second support 20 is rotatably coupled to the first support 10, the second support 20 coupled to the first support 10 can be appropriately rotated, which causes the device 200 coupled to the adjustment apparatus 100 at different angles and positions to meet the needs of the device 200 for viewing and using in different scenes and different angles.

Figure 5:
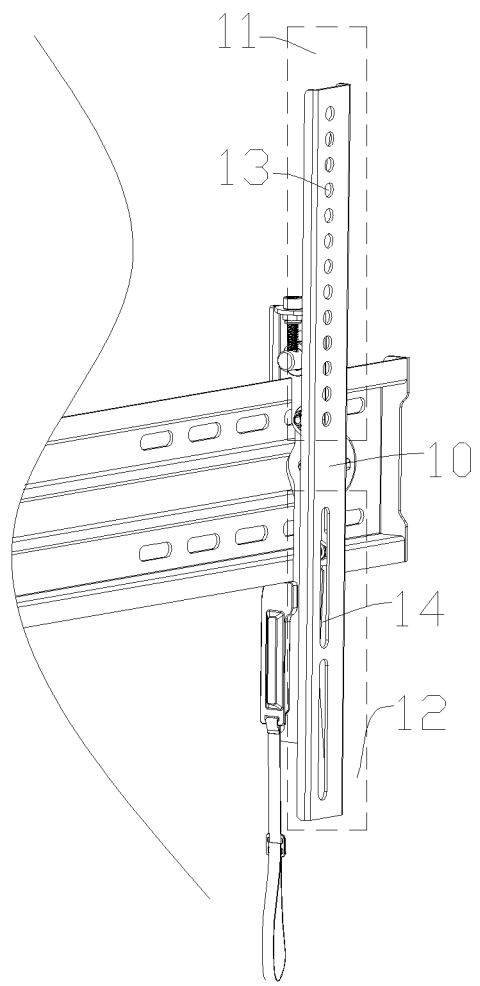
FIG. 5 is an enlarged view of a first support of the adjustment apparatus according to one embodiment of the present disclosure.

As shown in FIG. 5, the first support 10 defines first fixing holes 11 and second fixing holes 12, such that the first support 10 can be fixed by using the first fixing holes 11 and the second fixing holes 12. It can be understood that the first support 10 is fixed on the surface of the device 200, but the connection positions of the various devices 200 and the adjustment apparatus 100 provided by the embodiments of the present disclosure are not unified, so the first fixing holes 11 and the second fixing holes 12 are defined on the first support 10, for different fixing manners, it can be adjusted on the first fixing holes 11 and the second fixing holes 12 according to the device 200.

The first fixing holes 11 of the first support 10 can include at least two through holes 13. The second fixing holes can include at least two hollow grooves. It can be understood that the first support 10 defines a plurality of through holes 13 and a plurality of hollow grooves 14. The through holes 13 can fix the first support 10 on the device 200 stably, and the hollow grooves 14 can be used to adjust the fixed positions of the different devices 200, which makes the adjustment apparatus 100 suitable for different devices 200.

Figure 6:
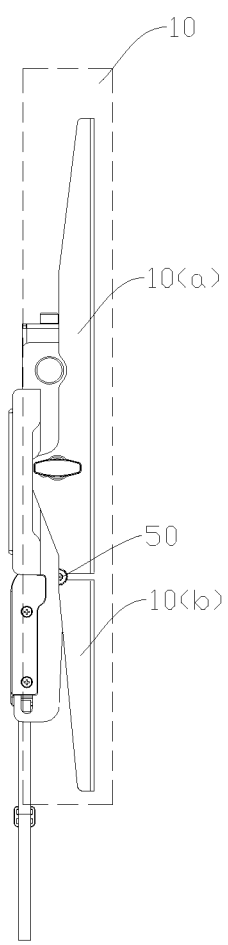
FIG. 6 is a schematic view of the adjustment apparatus including an upper support and a lower support according to another embodiment of the present disclosure.

As shown in FIG. 6, in some embodiments, the first support 10 includes an upper support 10(a) and a lower support 10(b). The upper support 10(a) is rotatably coupled to the lower support 10(b) so as to form the first support 10. The second support 20 is rotatably coupled to the upper support 10(a) of the first support 10. After the lower support 10(b) is fixed, the upper support 10(a) rotates so as to drive the second support 20 disposed on the upper support 10(a) to move. It can be understood that the second support 20 is rotatably coupled to the upper support 10(a) of the first support 10. When the lower support 10(b) is fixed on the device 200, the upper support 10(a) can be rotated by a rotational connection with the first support 10 to drive the second support 20 on the upper support 10 (a) to rotate as a whole. Of course, in other embodiments, the second support 20 can also be rotated and coupled to the lower support 10 (b) of the first support 10, and the upper support 10(a) of the first support 10 is fixed to the device 200 so that the lower support 10 (b) can rotate relative to the first support 10, to drive the second support 20 to rotate as a whole. It can be understood that the rotation connection of the upper support 10 (a) and lower support 10 (b) is a fastening connection, when the upper support 10 (a) or lower support 10 (b) is rotated to the preset position, a fastening switch 50 threadly fixed at a connection of the upper support 10 (a) and the lower support 10(b) causes the upper support 10(a) or the lower support 10(b) to be fixed in the preset position.

Figure 7:
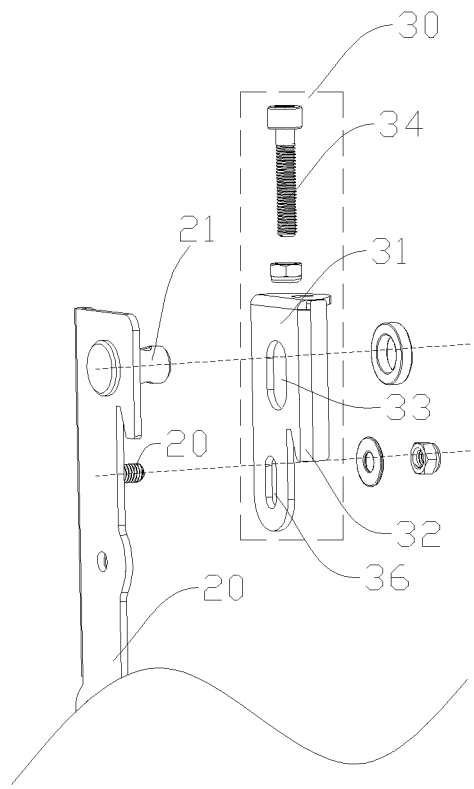
FIG. 7 is a schematic view showing a relationship between a fixed portion and a sliding groove as shown in FIG. 1.

As shown in FIG. 7, the first sliding groove 33 has a first end and a second end opposite to the first end. When the fixed portion 21 abuts the first end or the second end, the other end of the driving member 34 is always coupled to the fixed portion 21. It can be understood that the fixed portion 21 passes through the first sliding groove 33 of the connecting piece 31, and when the driving member 34 is threaded on the fixed portion 21, the fixed portion 21 slides within the first sliding groove 33 and a sliding of the fixed portion 21 is restricted by the first end or the second end of the first sliding groove 33, such that the movement of the driving member 34 screwed on the fixed portion can be limited by the sliding position of the fixing member. Meanwhile, since the fixed portion 21 abuts the first end or the second end, the other end of the driving member 34 is always coupled to the fixed portion 21, so that the driving member 34 does not break away from the connection with the fixed portion 21 due to the rotation, so that the manipulation of the entire adjustment apparatus 100 is more scientific, and it is no longer necessary to repeatedly install the driving member 34 and the fixed portion 21, and even the connecting piece 31 and the second support 20.

Figure 8:
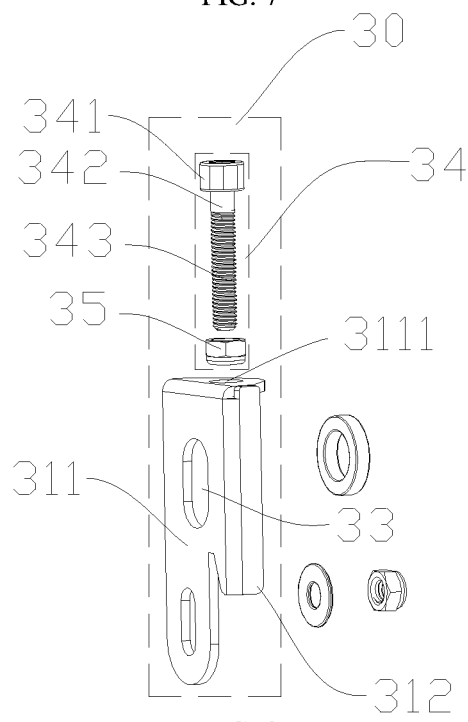
FIG. 8 is a schematic view showing a detail structure of the connecting piece as shown in FIG. 1.

As shown in FIGS. 7 and 8, the connecting piece 31 includes a main body 311 and a bending portion 312. The bending portion 312 is coupled to a top portion of one side of the main body 311. The top portion defines a first opening hole 3111. One end of the driving member 34 is blocked and coupled to the first through hole 3111 of the top portion. The fixed portion 21 passes through the first sliding groove 33 of the connecting piece 31. The other end of the driving member 34 extends along a direction away from the top portion until it is screwed to the fixed portion 21. Specifically, the first through hole 3111 is opened at a top portion of one side of the main body 311, and the driving member 34 extends along a direction away from the top portion until it is coupled to the fixed portion 21, and the connecting piece 31 is driven to slide relative to the second support 20 by the driving member 34 through screw transmission. It can be understood that one end of the driving member 34 is blocked by the first through hole 3111 at the top portion of the main body 311 of the connecting piece 31, and can only be rotated in the first through hole 3111, and the other end of the driving member 34 is screwed on the fixed portion 21, such that, the transmission direction of the driving member 34 can be limited by the fixed portion 21 and the first through hole 3111, and the relative moving direction of the connecting piece 31 and the second support 20 can be thus limited. It can be understood that the adjustment apparatus 100 drives a relative sliding between the connecting piece 31 and the second support 20 by a screw transmission of the driving member 34 and the fixed portion 21, and the bending portion 312 of the connecting piece 31 can protect the driving member 34 and the fixed portion 21, to prevent the driving member 34 and the fixed portion 21 from being deformed after receiving the impact during use, to affect the performance of the adjustment apparatus 100. At the same time, in some embodiments, the bending portion 312 of the connecting piece 31 is flanked by the hook 32 of the connecting piece 31 to increase the structural strength of the hook 32, and ensure that the adjustment apparatus 100 is hooked on the fixed support 300 more stably.

As shown in FIG. 8, the driving member 34 includes a rotating portion 341, a connecting portion 342, and a thread portion 343 coupled in sequence. The thread portion 343 protrudes from the top portion of the first through hole 3111 and is screwed to the fixed portion 21. The rotating portion 341 is located on one side of the top portion facing away from the fixed portion 21. The connecting portion 342 is restricted and coupled to the top portion of the first through hole 3111, and can further rotate in the top portion of the first through hole 3111. It can be understood that the connecting portion 342 of the driving member 34 is restricted to be attached to the top portion of the first through hole 3111, such that the driving member 34 is blocked to the top portion of the connecting piece 31. However, the fixed portion 21 includes an internal thread, and the thread portion 343 of the driving member 34 is matched thereto, such that, when the rotating portion 341 of the driving member 34 is rotated, the thread portion 343 is rotated to rotate the thread portion 343 into the internal thread of the fixed portion 21. Since the connecting portion 342 of the driving member 34 is restricted from being coupled to the top portion of the through hole 3111, and the end of the rotating portion 341 close to the top portion abuts against the top portion of the connecting piece 31, so that the driving portion integrally drives the connecting piece 31 to move along a direction of the driving member 34 moving close to the fixed portion 21, such that the hook 32 of the connecting piece 31 is driven to slide relative to the fixed portion 21. In some embodiments, the driving member 34 can be a cup head screw, a bolt, a screw, etc. The driving member 34 requires a limited relationship with the first through hole 3111 of the connecting piece 31 and the fixing member, and a thread transmission relationship of the driving member 34 and the fixed portion 21.

As shown in FIG. 8, the outer peripheral surface of the connecting portion 342 is a smooth curved surface 15, and the first adjustment assembly 30 further includes a limiting member 35 fixedly coupled to a portion of the connecting portion 342 exposed from the first through hole 3111 of the top portion. The limiting member 35 abuts on the top portion, such that the rotating portion 341 is spaced from the top portion by a predetermined distance. It can be understood that the connecting portion 342 is blocked into the first through hole 3111 at the top of the connecting piece 31. When the outer peripheral surface of the connecting portion 342 of the driving member 34 is a smooth curved surface 15, the rotating portion 341 of the driving member 34 can rotate relative to the driving member 34 more smoothly. The limiting member 35 is fixedly coupled to a portion of the connecting portion 342 exposed from first through hole 3111 of the top portion, and the limiting member 35 abuts on the top portion so that the rotating portion 341 is spaced from the top portion by a predetermined distance. In other words, a limiting member 35 is disposed between the top portion of the connecting piece 31 and the rotating portion 341 of the driving member 34, and the limiting member 35 abuts against the top portion, and when the rotating portion 341 rotates, it will generate friction with the top portion of the connecting piece 31, and when the limiting member 341 is located between the top portion of the rotating portion 341 and the rotating portion 341 of the driving member 34, the friction caused by the rotation and the rotation loss of the connecting piece 31 can be effectively eliminated, so that the rotation of the driving member 34 can be made easier, and the driving member 34 of the adjustment apparatus 100 can be easily rotated, saves time and labor. In some embodiments, the limiting member 35 can be a nut or a gasket, and the rotating portion 341 can be in surface contact with the top portion, and the threading effect of the driving member 34 and the fixed portion 21 can also be achieved.

Specifically, as shown in FIG. 8, the outer peripheral surface of the rotating portion 341 includes a plurality of protrusions. It can be understood that the rotating member 34 can rotate to drive the connecting piece 31 to slide relative to the fixed portion 21 on the second support 20, and the outer peripheral surface of the rotating portion 341 of the driving member 34 includes a plurality of protrusions, which can increase the friction between the human fingers and the rotating portion 341 of the driving member 34 during rotation, which makes the rotation and operation of the driving member 34 as a whole more convenient.

As shown in FIG. 7, the connecting piece 31 further defines a guiding groove 36. The guiding groove 36 has a same length extending direction as the first sliding groove 33. The second support 20 includes a guiding post 20. The guiding post 20 of the second support 20 passes through the guiding groove 36 of the connecting piece 31, so that the connecting piece 31 moves relative to the extension direction of the second support 20. It can be understood that when there is a transmission connection relationship between the fixed portion 21 and the driving member 34 which are located between the connecting piece 31 and the second support 20, rotating the driving member 34 will cause a relative sliding between the connecting piece 31 and the second support 20, so that repeated use of the reciprocating movement after long term use will result in a change of the sliding direction of the connecting piece 31 and the second support 20 to a certain extent, deviating from the preset sliding direction. Therefore, the guiding post 20 of the first support 10 passes through the guiding groove 36 of the connecting piece 31, so that another connecting relationship between the connecting piece 31 and the second support 20 is generated. And the length extending direction of the guiding groove 36 and the first sliding groove 33 are the same, which does not affect the fixing member sliding in the first sliding groove 33 of the connecting piece 31, and ensures that the rotation between the driving member 34 and the fixed portion 21 will cause the relative sliding of the connecting piece 31 and the second support 20 to be more stably.

Figure 9:
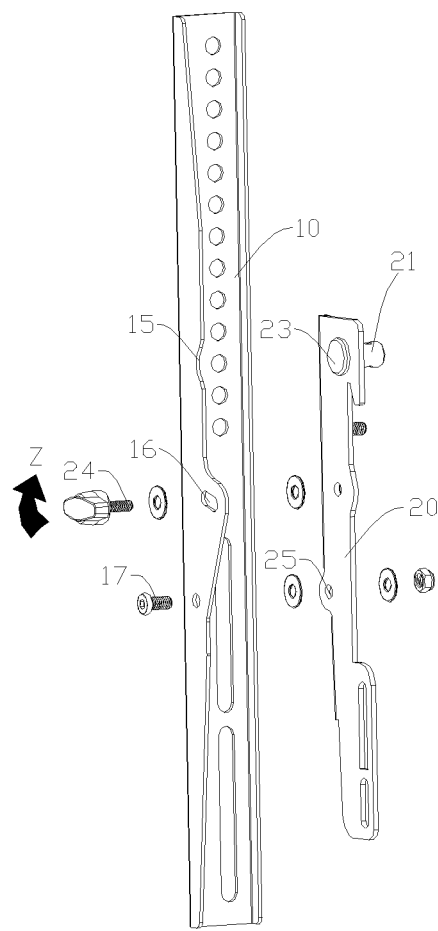
FIG. 9 is a schematic diagram showing a relationship between the first support and the second support as shown in FIG. 1.

As shown in FIG. 9, one side of the second support 20 away from the fixed portion 21 has a limiting protrusion 23 protruding therefrom, and the limiting protrusion 23 can abut the first support 10 or separate from the first support 10 as the second support 20 rotates relative to the first support 10. It can be understood that the second support 20 is rotatably coupled to the first support 10, and when the second support 20 coupled to the first support 10 is rotated, the rotation range is limited by the limiting protrusion 23. In some embodiments, one side of the second support 20 opposite to the fixed portion 21 includes the limiting protrusion 23; when the second support 20 is rotated in a first direction Z to a same horizontal direction as the first support 10, the limiting protrusion 23 abuts the first support 10, and the rotation of the second support 20 is restricted, such that the adjustment apparatus 100 is in a fixed state. When the second support 20 rotates in a direction opposite to the first direction Z, the limiting protrusion 23 of the second support 20 is separated from the first support 10.

Specifically, as shown in FIG. 9, the first support 10 has a curved surface 15, and the limiting protrusion 23 can abut the curved surface 15 of the first support 10 or separate from the curved surface 15 of the first support 10 as the second support 20 rotates relative to the first support 10. In some embodiments, the limiting protrusion 23 of the second support 20 is a circular protrusion or an elliptical protrusion, and the curved surface 15 of the first support 10 conforms to a shape of the limiting protrusion 23 of the second support 20. When the second support 20 rotates along the first direction Z relative to the first support 10 and abuts the curved surface 15 of the first support 10, the limiting protrusion 23 of the second support 20 is combined with the curved surface 15 of the first support 10, and the second support 20 rotates in an opposite direction of the first direction Z, the limiting protrusion 23 of the second support 20 separate from the curved surface 15 of the first support 10.

Figure 10:
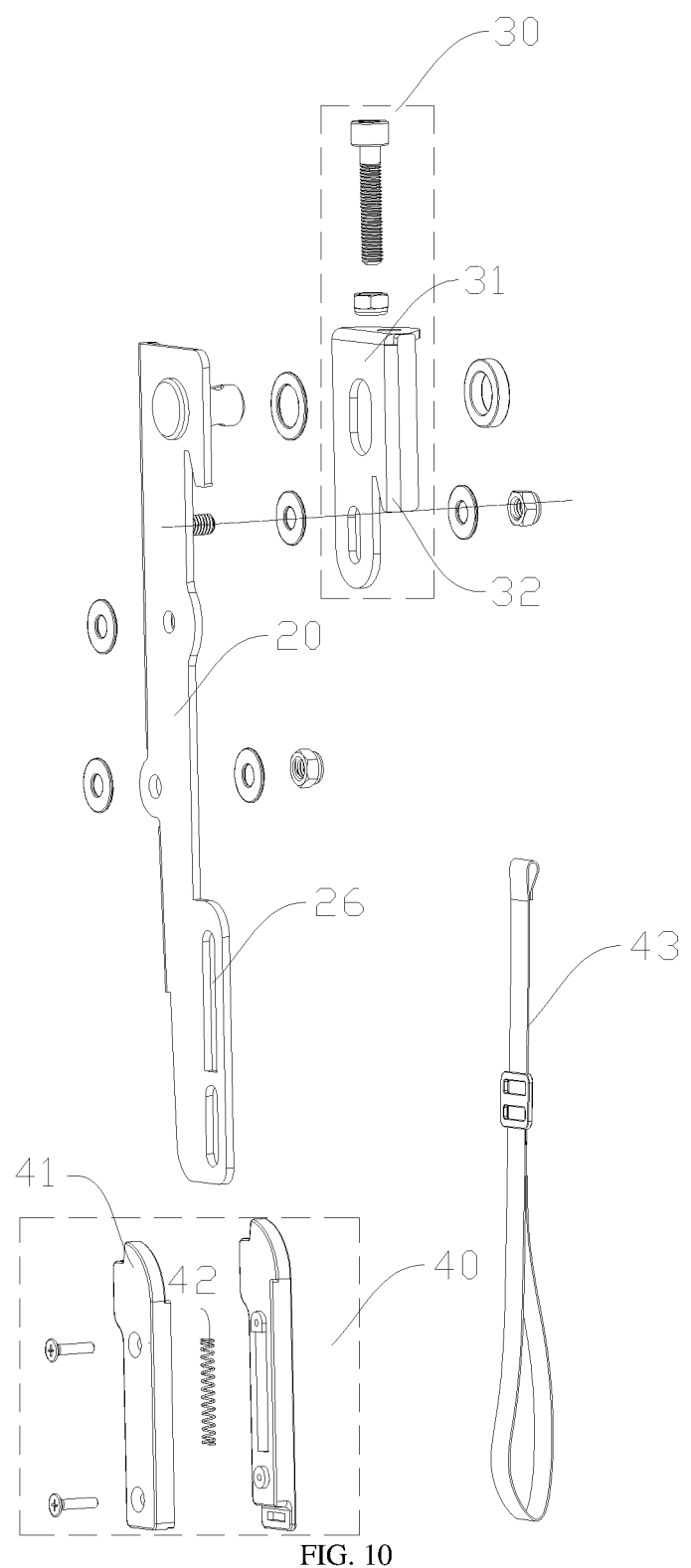
FIG. 10 is a schematic view of the adjustment apparatus including a second adjustment assembly according to one embodiment of the present disclosure.

As shown in FIG. 10, the second support 20 further includes a second adjustment assembly 40. The second adjustment assembly 40 is slidably disposed on the second support 20 and spaced apart from the first adjustment assembly 30. A distance between the second adjustment assembly 40 and the first adjustment assembly 30 can be adjusted. It can be understood that when the hook 32 of the connecting piece 31 of the first adjustment assembly 30 is hooked to one side of the fixed support 300, the second adjustment assembly 40 is coupled to the other side of the fixed support 300 and spaced apart from the first adjustment assembly 30 and opposite to the device 200, so that the adjustment apparatus 100 is coupled to the fixed support 300 stably. Meanwhile, as the distance between the second adjustment assembly 40 and the first adjustment assembly 30 can be adjusted, the distance between the two can be adjusted to suit different fixed supports 300 and devices 200.

As shown in FIG. 10, the second adjustment assembly 40 includes a hook 41 and an elastic member 42, and the hook 41 is slidably coupled to the second support 20 so that the distance between the second adjustment assembly 40 and the first adjustment assembly 30 can be adjusted, and one side of the hook 41 toward the connecting piece 31 has a hook portion 32, The elastic member 42 is elastically coupled between the second support 20 and the hook 41. When the elastic member 42 is compressed, the hook 41 moves away from the connecting piece 31, and when the elastic member 42 is restored, the hook 41 moves toward the connecting piece 31.

As shown in FIG. 10, one side of the second adjustment assembly 40 opposite to the hook 41 includes a pulling member 43. After the pulling member 43 is pulled, the elastic member 42 is compressed, and the hook 41 is moved in the direction of the pulling member 43. In some embodiments, the second support 20 further includes a sliding rail 26, and the hook 41 is set on the sliding rail 26, and the hook 41 moves toward the pulling member 43 under the restriction of the sliding rail 26 to drive the second adjustment assembly 40 to slide in an opposite direction of the first adjustment assembly 30.

In some embodiments, the number of first adjustment assemblies 30 is two, and the two first adjustment assemblies 30 are located on two sides of the second support 20, respectively. It can be understood that when the two first adjustment assemblies 30 are located on two sides of the second support 20, respectively, the hooks 32 of the connecting pieces of the two first adjustment assemblies 30 may be oppositely disposed or oriented in the same direction, or may be set in opposite directions according to the fixed support 300. The two first adjustment assemblies 30 are placed on the second support 20, which will make the connection between the adjustment apparatus 100 and the fixed support 300 more secure.

As shown in FIG. 9, the first support 10 further includes a rotating member 17, and the second support 20 also defines a connecting hole 25, and the rotating member 17 passes through the connecting hole 25 of the second support 20 so that the second support 20 is rotatably coupled to the first support 10. In some embodiments, the rotating member 17 of the first support 10 is a screw that passes through the connecting hole 25 of the second support 20 and is secured using a nut, but still ensures that the second support 20 is rotatably coupled to the first support 10. Of course, in other embodiments, the connecting member 25 of the second support 20 and the rotating member 17 of the first support 10 may be other structures, such as a rotating shaft, etc., and the specific structures of the connecting member and the connecting hole 25 are not strictly limited.

Figure 11:
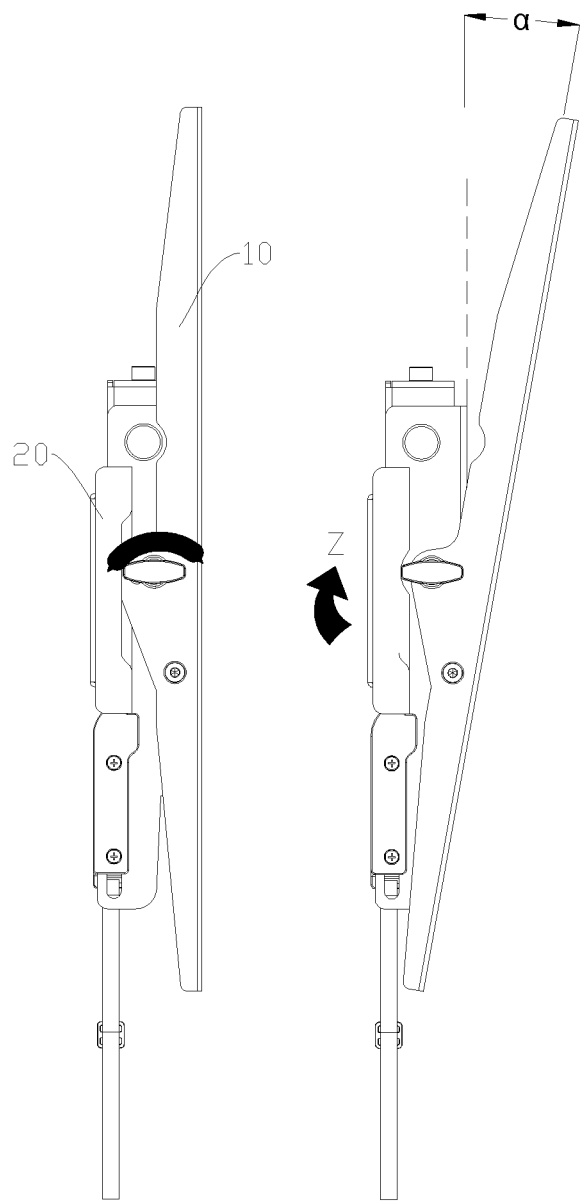
FIG. 11 is a schematic view showing a structure of a fastening piece rotated in Z direction according to one embodiment of the present disclosure.

It can be understood that, as shown in FIG. 9, the first support 10 further defines a limiting groove 16, and the first support 10 further includes a fastening piece 24, and the fastening piece 24 on the first support 10 is engaged with the limiting groove 16 of the first support 10. The second support 20 is rotatably coupled to the first support 10 to drive the fastening piece 24 to move within the limiting groove 16 of the first support 10. After the second support 20 is rotated along the first direction Z to a certain angle, the fastening piece 24 moves in the limiting groove 16 of the first support 10 and moves to one end of the limiting groove 16. Under the limitation of the limiting groove 16, the second support 20 cannot continue to rotate in the first direction Z. When the second support 20 rotates in an opposite direction of the first direction Z to a certain angle, the fastening piece 24 moves in the limiting groove 16 and moves to the other end of the limiting groove 16 and is restricted by the other end of the limiting groove 16, so that the second support 20 cannot continue to rotate in the opposite direction of the first direction Z. As shown in FIG. 11, when the second support 20 is rotated relative to the first support 10 by a predetermined angle α to a preset position, the fastening piece 24 is screwed in the first direction Z to fix the second support 20 at the first support 10, it is impossible to rotate. However, when the fastening piece 24 is rotated in the opposite direction of the first direction Z, so that the second support 20 can be re-rotated and coupled to the first support 10 to realize the adjustment of the using angle of the adjustment apparatus 100.

Specifically, as shown in FIG. 9, the length of the first support 10 is greater than that of the second support 20. When the fastening piece 24 slides to one end of the limiting groove 16 of the first support 10, one end of the second support 20 abuts on the first support 10. It can be understood that the second support 20 is rotatably coupled to the first support 10, and the first support 10 is longer than the second support 20. When the second support 20 is rotated along the first direction Z to a certain angle, the fastening piece 24 moves in the limiting groove 16 of the first support 10 and moves to one end of the limiting groove 16. Under the limitation of the limiting groove 16, the second support 20 cannot continue to rotate in the first direction Z, and one end of the second support 20 abuts on the first support 10. After the second support 20 rotates a certain angle in the opposite direction of the first direction Z, the fastening piece 24 moves in the limiting groove 16 and moves to the other end of the limiting groove 16 and is limited by the other end of the limiting groove 16, such that the second support 20 cannot be rotated in the first direction Z while the other end of the second support 20 abuts on the first support 10. In order to make the second support 20 rotate and connect to the first support 10, there are multiple limiting structures, and under the premise of ensuring the rotational connection of the second support 20 and the first support 10, the adjustment apparatus 100 has the adjustment function at different angles and different scenarios. At the same time, due to the multiple limiting structure, it is ensured that after the long-term use of the adjustment apparatus 100, when one of the multiple limit structures is damaged, the other parts can continue to play a limiting function role, so that the adjustment apparatus 100 has a certain structural strength and prevents the second support 20 from excessive rotation on the first support 10 to destroy the limit structure which causes the adjustment apparatus 100 to deform.

Figure 12:
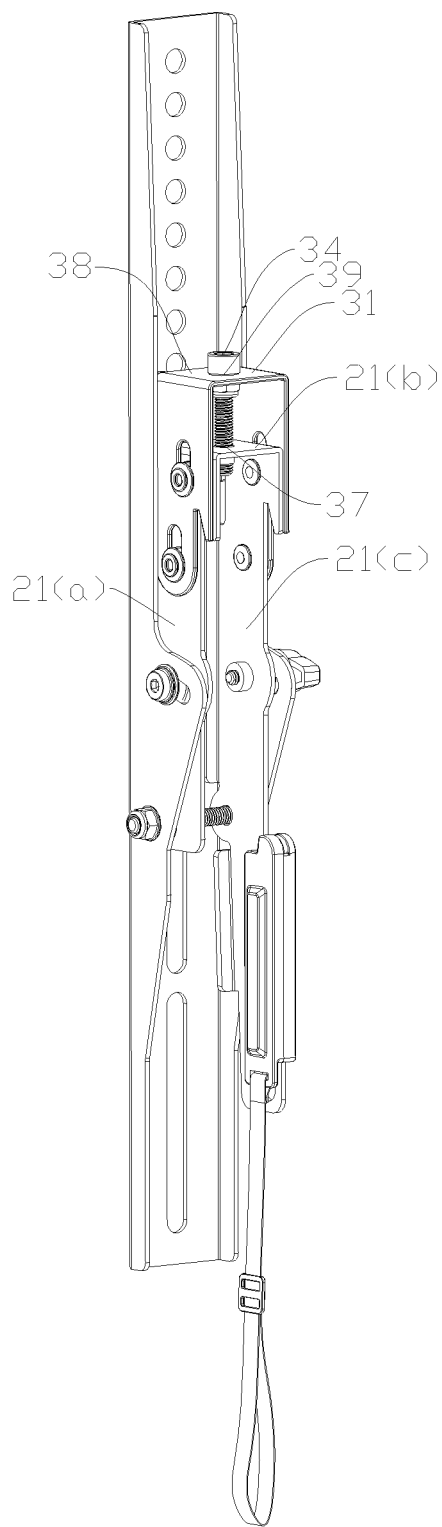
FIG. 12 is a schematic view showing a structure of a second support and a connecting piece provided by another embodiment of the present disclosure.
Figure 13:
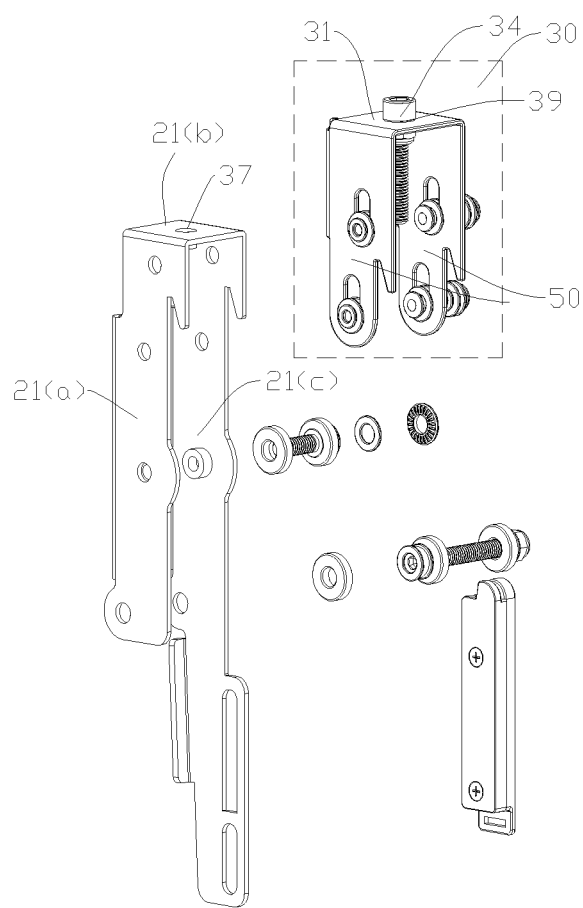
FIG. 13 is a schematic exploded view of the second support and the connecting piece according to another embodiment of the present disclosure.

In some embodiments, as shown in FIGS. 12 and 13, the fixed portion 21 includes a first sub-bracket 21 (a), a second sub-bracket 21 (b), and a third sub-bracket 21 (c). The first sub-bracket 21(a) is opposite to the third sub-bracket 21(c), the second sub-bracket 21(b) has a threaded hole 37, the connecting piece 31 has a top portion 38, the top portion 38 is opposite to the second sub-bracket 21(b) and spaced apart from the second sub-bracket 21(b) with a distance. The top portion 38 defines a second through hole 39. One end of the driving member 34 is engaged with the second through hole 39 of the top portion 38, and the other end of the driving member 34 extends in a direction away from the top portion 38 until the threaded hole is screwed to the threaded hole 37 of the second sub-bracket 21(b). The two ends of the top portion 38 of the connecting piece 31 includes two oppositely disposed hook pieces respectively. When the driving member 34 is screwed, the connecting piece 31 is moved relative to the fixed portion 21. Of course, in some embodiments, the first through hole 3111 and the second through hole 39 may be a same through hole. Specifically, the second adjustment assembly 40 can be selected to be set on the first sub-bracket 21(a) or the third sub-bracket 21(c), and adjusted according to the actual application scenario.

The features mentioned above in the specification, claims, and drawings may be combined with each other as long as they are meaningful within the scope of the present application.

The above are embodiments of the present disclosure, and it should be noted that those skilled in the art may make some improvements and modifications without departing from the principle of the present disclosure, and these improvements and modifications are also the protection scope of the present disclosure.

What is claimed is:

1. An adjustment apparatus, wherein, comprises:
a first support;
a second support, the second support being rotatably coupled to the first support; the second support comprising a fixed portion;
a first adjustment assembly comprising a connecting piece and a driving member;
the connecting piece defining a hook and a first sliding groove; one end of the driving member being blocked by the connecting piece, and further rotating relative to the connecting piece, an other end of the driving member extending along a direction close to the fixed portion, and being further screwed to the fixed portion; wherein, the driving member rotates to drive the connecting piece to slide relative to the fixed portion of the second support, so as to enable the hook to slide relative to the fixed portion;
wherein, the connecting piece comprises a main body and a bending portion; the bending portion is coupled to a top portion of a side of the main body; the top portion defines a first through hole; the one end of the driving member is blocked and coupled to the first through hole of the top portion; the fixed portion protrudes from the second support, and the fixed portion passes through the first sliding groove of the connecting piece, and the other end of the driving member extends towards a direction away from the top portion until it is screwed to the fixed portion;
wherein, the driving member comprises a rotating portion, a connecting portion and a thread portion coupled in sequence; the thread portion protrudes from the first through hole of the top portion, and is further screwed to the fixed portion; the rotating portion is located on one side of the top portion away from the fixed portion; the connecting portion is blocked and coupled to the first through hole of the top portion, and can further rotate in the first through hole of the top portion.

2. The adjustment apparatus according to claim 1, wherein, an outer peripheral surface of the connecting portion is a smooth curved surface; the first adjusting assembly further comprises a limiting member; the limiting member is fixedly coupled to a portion of the connecting portion exposing the first through hole of the top portion; the limiting member abuts on the top portion such that the rotating portion is spaced apart from the top portion by a predetermined distance.

3. The adjustment apparatus according to claim 1, wherein, the first adjusting assembly further comprises a spacer which is sleeved on the driving member, and located between the rotating portion and the top portion.

4. The adjustment apparatus according to claim 1, wherein, an outer peripheral surface of the rotating portion comprises a plurality of protrusions.

5. The adjustment apparatus according to claim 1, wherein, the rotating portion and the top portion are surface contact.

6. The adjustment apparatus according to claim 1, wherein, the first sliding groove has a first end and second end opposite to the first end; when the fixed portion abuts the first end or the second end, the other end of the driving member is always coupled to the fixed portion.

7. The adjustment apparatus according to claim 1, wherein, the connecting piece further defines a guiding groove; an extending direction of the guiding groove is same to that of the first sliding groove; the second support comprises a guiding post; the guiding post of the second support passes through the guiding groove of the connecting piece, such that the connecting piece moves along an extending direction of the second support.

8. The adjustment apparatus according to claim 1, wherein, one side of the second support away from the fixed portion comprises a limiting protrusion; the limiting protrusion abuts the first support or separates from the first support with a rotation of the second support relative to the first support.

9. The adjustment apparatus according to claim 8, wherein, the first support has a curved surface; the limiting protrusion abuts the curved surface of the first support or separates from the curved surface of the first support with the rotation of the second support relative to the first support.

10. The adjustment apparatus according to claim 1, wherein, the second support comprises a second adjustment assembly slidably coupled to the second support, and spaced and opposite to the first adjustment assembly; a distance between the second adjustment assembly and the first adjustment assembly is adjusted.

11. The adjustment apparatus according to claim 10, wherein, the second adjustment assembly comprises a hook and an elastic member; the hook is slidably coupled to the second support; the hook comprises a hook portion facing one side of the connecting piece; the elastic member is elastically coupled between the second support and the hook.

12. The adjustment apparatus according to claim 11, wherein, one side of the second adjustment assembly opposite to the hook comprises a pulling member; after the pulling member is pulled, the elastic member is compressed, and the hook moves in a direction of the pulling member.

13. The adjustment apparatus according to claim 1, wherein, a number of the first adjustment assembly is two; the two first adjustment assemblies are located on two sides of the second support.

14. The adjustment apparatus according to claim 1, wherein, the first support further comprises a rotating member; the second support defines a connecting hole; the rotating member passes through the connecting hole of the second support, such that the second support is rotatably coupled to the first support.

15. The adjustment apparatus according to claim 1, wherein, the first support further defines a limiting groove; the second support further comprises a fastening piece; the fastening piece of the second support is engaged with the limiting groove of the first support, the second support is rotatably coupled to the first support, such that the fastening piece is driven to move in the limiting groove of the first support.

16. The adjustment apparatus according to claim 15, wherein, a length of the first support is greater than that of the second support; when the fastening piece slides to one end of the limiting groove of the first support, one end of the second support abuts the first support.

17. The adjustment apparatus according to claim 1, wherein, the first portion comprises a first sub-bracket, a second sub-bracket, and a third sub-bracket coupled in sequence; the first sub-bracket is opposite to the third sub-bracket; the second sub-bracket defines a screw hole; the connecting piece has the top portion; the top portion is disposed opposite to the second sub-bracket and separate to the second sub-bracket with a distance; the top portion defines a second through hole; the one end of the driving member is blocked and coupled to the second through hole of the top portion, and the other end of the driving member extends along a direction away from the top portion until it is screwed to the screw hole of the second sub-bracket.

18. The adjustment apparatus according to claim 1, wherein, the adjustment apparatus further comprises a fixed support; the fixed support comprises two sets of horizontal brackets and vertical brackets coupled with each other; the hook of the connecting piece is engaged with the fixed support, such that the adjustment apparatus is fixed through the fixed support.

19. The adjustment apparatus according to claim 1, wherein, the first support defines first fixing holes and second fixing holes, such that the first support is fixed by using the first fixing holes and the second fixing holes.

20. The adjustment apparatus according to claim 19, wherein, the first fixing holes of the first support comprises at least two through holes, and the second fixing holes comprises at least two hollow grooves.

21. The adjustment apparatus according to claim 1, wherein, the first support comprises an upper support and a lower support; the upper support is rotatably coupled to the lower support so as to form the first support; the second support is rotatably coupled to the upper support of the first support; after the lower support is fixed, the upper support rotates so as to drive the second support on the upper support to move.

* * * * *